United States Patent [19]

Benedetti et al.

[11] Patent Number: 4,992,680

[45] Date of Patent: Feb. 12, 1991

[54] PROGRAMMABLE LOGIC DEVICE HAVING A PLURALITY OF PROGRAMMABLE LOGIC ARRAYS ARRANGED IN A MOSAIC LAYOUT TOGETHER WITH A PLURALITY OF INTERMINGLINGLY ARRANGED INTERFACING BLOCKS

[75] Inventors: Mirella Benedetti, Vimercate; Antonio Chiriatti, Reggio Calabria; Vincenzo Daniele, Brugherio; Biagio Giacalone, Trapani, all of Italy

[73] Assignee: SGS-Thomson Microelectronics s.r.l., Italy

[21] Appl. No.: 456,782

[22] Filed: Dec. 27, 1989

[30] Foreign Application Priority Data

Dec. 28, 1988 [IT] Italy ............................ 83691 A/88

[51] Int. Cl.⁵ .......................................... H03K 19/177
[52] U.S. Cl. .................................. 307/465; 307/465.1; 307/303.1
[58] Field of Search ................... 307/465–469, 307/303, 303.1; 365/189.08; 357/45

[56] References Cited

U.S. PATENT DOCUMENTS

| | | | |
|---|---|---|---|
| 4,482,984 | 11/1984 | Onitani | 365/189.08 X |
| 4,600,995 | 7/1986 | Kino et al. | 307/465.1 X |
| 4,745,579 | 5/1988 | Mead et al. | 365/189.08 X |
| 4,855,958 | 8/1989 | Ikeda | 365/189.08 X |
| 4,910,417 | 3/1990 | El Gamal et al. | 307/465 |
| 4,912,345 | 3/1990 | Steele et al. | 307/465 |

*Primary Examiner*—David Hudspeth
*Attorney, Agent, or Firm*—Pollock, Vande Sande & Priddy

[57] ABSTRACT

A programmable logic device has an architecture which permits to implement logic functions through loopable multi-levels by utilizing a network of distributed memory arrays organized as a mosaic of arrays of programmable memory cells and multifunctional interfacing blocks. Each of said blocks contains an input selection circuitry capable of receiving input signals coming from bidirectional input/output pins and/or from outputs of said arrays, signal selection means, polarity selection means and path selection means and an output sorting circuitry capable of selecting nonstored or stored type, data containing signals, selecting the polarity and the path of said signals toward enableable output drive buffers of said plurality of bidirectional input/output pins and/or toward the inputs of any one of said arrays, a circuitry capable of producing for each of said signals a first, non-inverted, and a second, inverted, buffered replica signals with which to drive the rows of one or more of said memory arrays for causing the output of signals from those arrays, each array being programmable in order to perform different logic functions for any combination of inputs thereof and the exchange between two different arrays and between an array and the external world taking place essentially through at least one of said multfunctional blocks.

4 Claims, 13 Drawing Sheets

PROGRAMMABLE LOGIC DEVICE HAVING A PLURALITY OF PROGRAMMABLE LOGIC ARRAYS ARRANGED IN A MOSAIC LAYOUT TOGETHER WITH A PLURALITY OF INTERMINGLINGLY ARRANGED INTERFACING BLOCKS

BACKGROUND OF THE INVENTION

1. Field of the Invention

The present invention relates generally to integrated programmable logic array devices, normally fabricated by the CMOS technology and employing floating gate transistors of the EPROM, EEPROM or FLASH type as the programmable unitary cell, also to devices where the programmable unitary cell is a fuse or a ROM type cell or the like.

2. Discussion of the Technology and Prior Art

The development of fabrication techniques for large scale integration (LSI, VLSI, and more recently ULSI) permits to implement more and more complex logic functions on a single chip, but the necessity remains of utilizing numerous circuits of "dispersed logics" for interfacing the integrated device in function of the specific application of the user. To avoid this, integrated circuits capable of providing logic functions no longer rigidly predefined during the fabrication of the integrated device but directly programmable by the user in function of his needs, have been developed. These integrated devices, known by the acronyms FPLA (Field Programmable Array Logic) and PLA (Programmable Logic Array) customarily use a basic array structure which has been developed in the field of the storage or small and medium quantities of data (PROM, EPROM and EEPROM arrays) and which utilizes row and column organized arrays of individually programmable and addressable floating gate CMOS transistors (cells).

The block diagram of a generic programmable logic array integrated device is depicted in FIG. 1. The symbolic structure of a hypothetic, four inputs, four logic products and two outputs FPLA device is shown in FIG. 2, where I1, I2, I3 and I4 represent the input terminals, the AND array contains a rows and colums matrix of programmable cells (floating gate transistors), the function of which is depicted in FIG. 2 by the crosses (X) indicating an electric connection, removable by programming, between a row and a column of the array. The outputs from the AND array constitute as many inputs of an OR array which is also formed by a matrix of programmable memory cells, functionally indicated by the crosses (X) indicating an electric connection, removable by programming, between a row and a column of the array. This family of devices (FPLA or PLA) is described in U.S. Pat. Nos.: 3,500,142 (Kahng); 3,660,819 (Frohman-Bentchkowsky); 3,728,695 (Frohman-Bentchkowsky); 3,744,036 (Frohman-Bentchkowsky); 3,755,721 (Frohman-Bentchkowsky); 3,825,946 (Frohman-Bentchkowsky); 3,984,822 (Simko, et al.) and 4,019,197 (Lohstroh, et al.).

A related family of devices is represented by the devices known by the tradename PAL® (PAL® being a registered trademark of Monolithic Memories Corp.), wherein the OR structure is made in a wired circuit form, i.e. unprogrammable by the user, thus eliminating one array of memory cells. These devices are described for example in U.S. Pat. Nos.: 3,541,543 (Crawford, et al.); 3,566,153 (Spenser, Jr.); 3,702,985 (Proebsting); 3,816,725 (Greer); 3,818,452 (Greer); 3,849,638 (Greer); 4,609,986 (Hartman, et al.) and 4,617,479 (Hartmann, et al.).

Therefore a programmable logic device (PLD) is substantially formed by two programmable arrays (one of which may be unmodifiable by the user). These integrated devices are provided further with ancillary circuits such as buffers, registers, output pin drivers and multiplexers. In terms of overall versatility, the "programming resources" of such a PLD device are represented by the programmable arrays (in some of these devices the OR array may be disposed of and substituted by equivalent wired circuits), while the input circuitry of the AND array and the output circuitry of the OR structure may be classified as "fixed resources". Moreover in some of these devices, the output circuitry itself of the OR array (or fixed OR structure) may comprise programmable circuits for producing a non-stored (combinative logic) or a stored, non-inverted or inverted, signal replica of any of the OR array (or fixed OR structure) output signals beside presenting the same output signal on a respective bidirectional data input-/output (I/O) pin of the integrated device by enabling a respective output buffer and also on an internal feedback bus in order to return the signal at an input of the AND array in order to implement a desired logic function.

These output circuit blocks may also be made so as to permit field programming thereof, through permanently openable fuses or like devices: Descriptions of input/output blocks of this kind are contained in U.S. Pat. Nos.: 4,677,318 (Veenstra) and 4,717,912 (Harvey, et al.) and every pertinent portion of said descriptions is intended to be incorporated herein.

By observing the functional block diagram of these known devices depicted in FIG. 1, the "rigidity" of such an architecture which imposes a compulsory starting "level", i.e. the AND array, will be evident. Moreover a severe drawback of the prior art devices is represented by the fact that in order to feedback a signal to the input of the starting "level" (AND array inputs) pads or output pins of the integrated device must be used and the device has obvious physical limitations of the total number of external pins, a number of which (1, 2, 3 ..., k) are necessarily "dedicated" data input pins, unavailable for implementing a feedback path.

OBJECTIVE AND SUMMARY OF THE INVENTION

The main objective of the present invention is to overcome these drawbacks of logic array devices of the prior art by providing a device having a basically different organization of its programming resources, which are organized in the form of a netlike layout of distributed programmable logic arrays, each of which provides, by comparison with a conventional type device, a logic array which is not necessarily restrained to perform a pre-definite logic function.

Each array or "level" is associated with a plurality of multifunctional interface blocks each containing an input selection circuitry capable of receiving input signals coming from bidirectional input/output terminals and/or from the outputs of another array and further comprising means for reading said output signals of said other array, signal selection means, polarity selection means and path selection means, a plurality of registers and an output sorting circuitry capable of selecting combinatorial logic (non-stored) type and/or stored data signals, selecting the polarity and the path of the signals toward enableable output drive buffers of said plurality of bidirectional input/output pins and/or toward another array, a circuitry capable of producing for each of said signals a first, non-inverted, buffered, replica signal and a second inverted, buffered, replica signal with which to drive the rows of one or more memory arrays in order to cause the output of signals from said arrays, each array being individually programmable in order to produce logic functions for any combination of the inputs thereto.

In other words, the organization of the device of the invention may be configurable as a "mosaic" of programmable memory cell arrays and of said multifunctional circuit blocks. Each array or "level" being capable of interacting with external, essentially bidirectional input/output (I/O) pins of the device and/or with another array or level of programmable memory cells, through at least one of said multifunctional circuit blocks.

A fundamental result of such an architecture is the achievement of the possibility of implementing an outstandingly large number of feedbacks or internal paths for the signals without necessarily engaging a pin (or pad) of the integrated device.

Another result is that of allowing the access through any I/O pin of the device to any one of the arrays or "levels" as well as permitting the output through any I/O pin of the device from anyone of said programmable memory arrays or "levels".

Moreover by considering that said multifunctional circuit blocks are capable of providing both the non-inverted and the inverted replicas of either a stored-type signal or a non-stored type signal, each array or level may be programmed so that the outputs thereof provide any kind of logic operation upon the inputs thereof, besides of course being possible to program input and output paths within the array desirably in the form of electrical connections in order to implement the necessary connections or paths for the signals through the "mosaic" of said arrays and multifunctional blocks.

Essentially the device is provided with a single type of input/output (I/O) pins (or I/O blocks containing suitable enableable output drive buffers for bidirectional pins), which may be "reached" or from which any one of said memory cell arrays or programmable levels may be "reached". through at least one of said multifunctional circuit blocks.

DESCRIPTION OF PREFERRED EMBODIMENTS OF THE INVENTION

Figure 1:
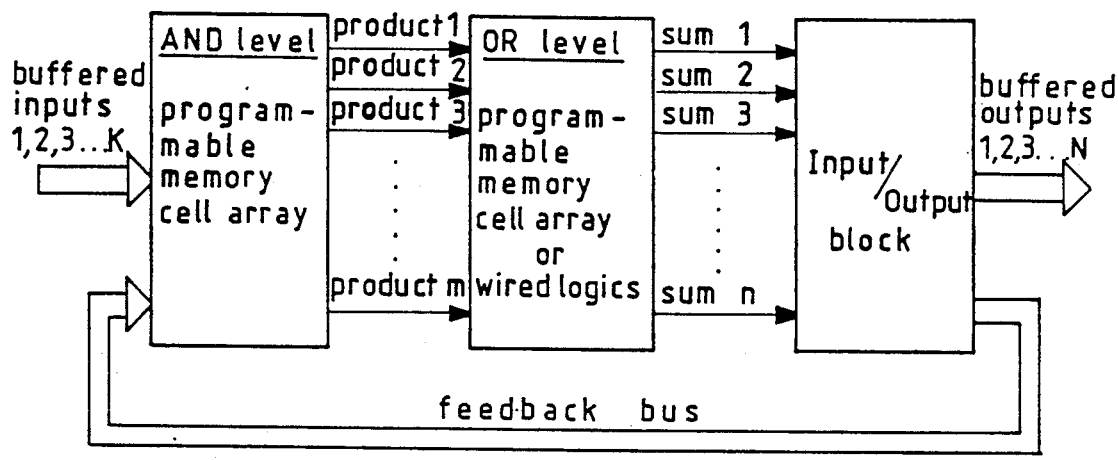
FIG. 1 is a block diagram of a typical integrated programmable logic array circuit of the prior art.
Figure 2:
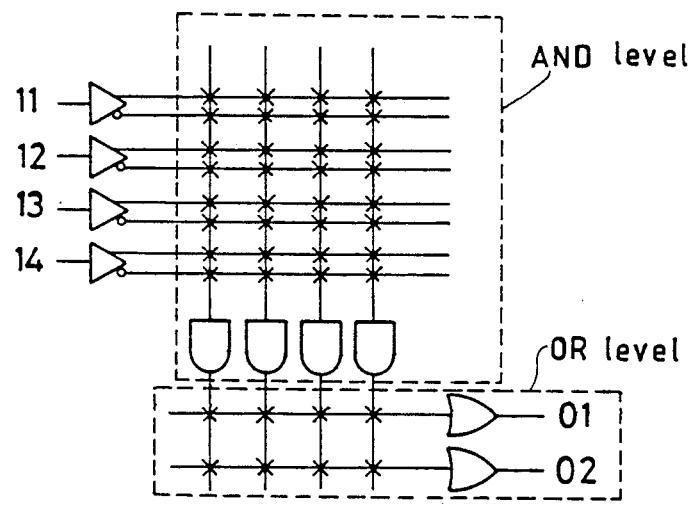
FIG. 2 shows the symbolic structure of the two arrays of programmable cells, respectively belonging to an AND "level" and to an OR "level" cascaded therefrom, according to the prior art.
Figure 3:
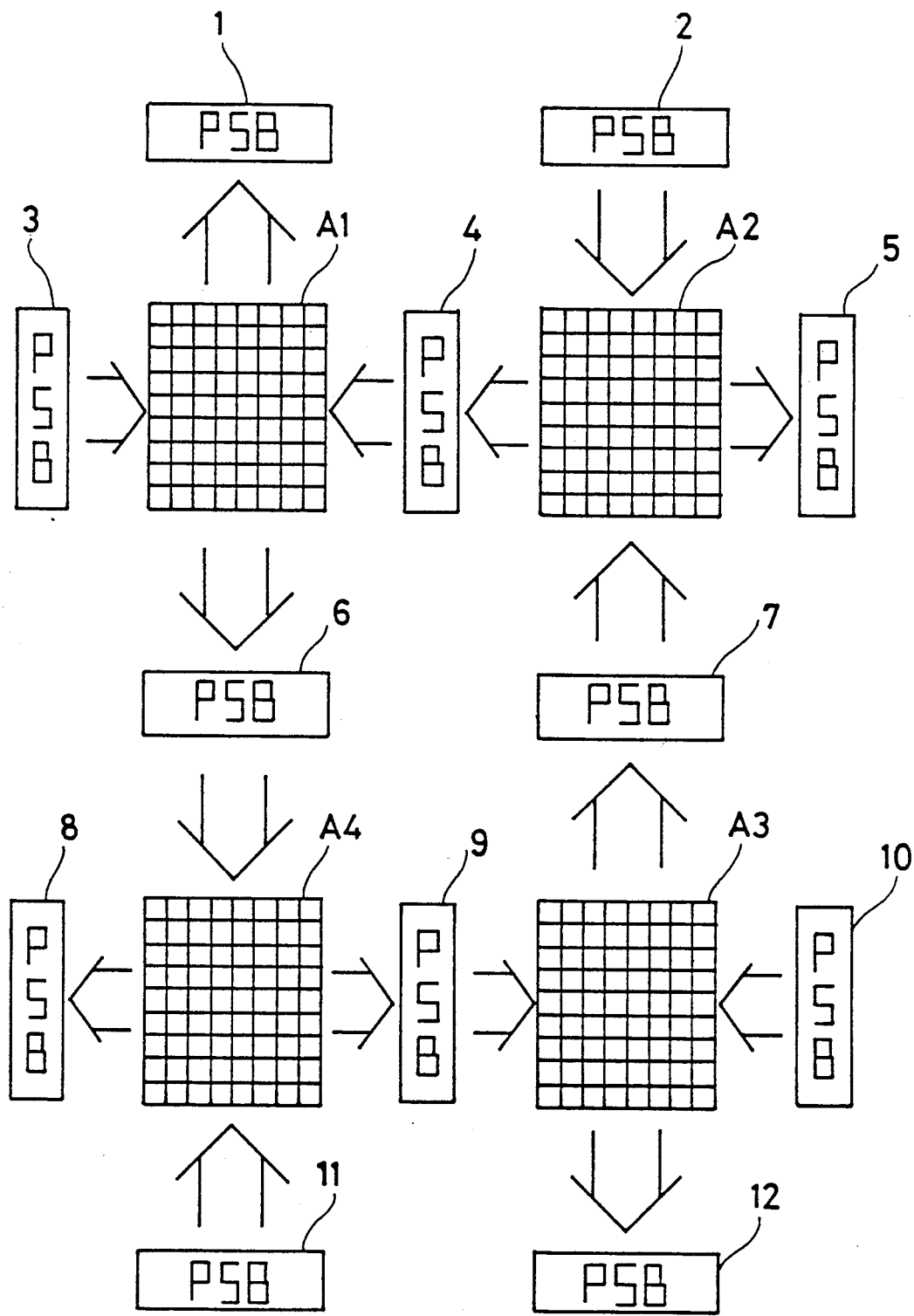
FIG. 3 illustrates the basic architecture of the programmable integrated logic array circuit of the present invention.

The basic architecture of a logic device with a network of distributed memory cell arrays in accordance with the instant invention is depicted in FIG. 3. In the figure four distinct arrays of programmable memory cells: respectively A1, A2, A3 and A4, conventionally arranged in rows and columns and which may be individually programmed by altering their conductivity status, are depicted. The memory cells are preferably of the EPROM or EEPROM type.

The four arrays are organized in a "mosaic" together with a certain number of multifunctional circuit blocks (PSB) 1, 2, 3, . . . 11 and 12.

This is a first and fundamental distinctive feature of the device of the invention in respect to the devices of the prior art wherein the OR array is directly cascaded from the AND array and wherein the output signals of the AND array are available only in a non-inverted form and not in an inverted form, simultaneously.

A second distinctive feature is represented by the physical presence of more than two memory arrays, functionally complete and freely communicating among each other. This allows to implement "multiple level" functions by fully exploiting the potentiality of present multilevel synthesis techniques.

A third distinctive aspect is the possibility of implementing sequential functions through the plurality of combinatorial logic levels because of the presence of the interfacing multifunctional PSB blocks among the arrays, i.e. among logic levels, each PSB block containing a relatively large number of registers, made by "wired" logic techniques.

A fourth distinctive feature is that the special architecture allows the access of all the bidirectional input/output pins from any memory array and viceversa, through one or several PSB blocks, thus allowing an outstanding interfacing capability of the device among other devices within a complex system.

Figure 4:
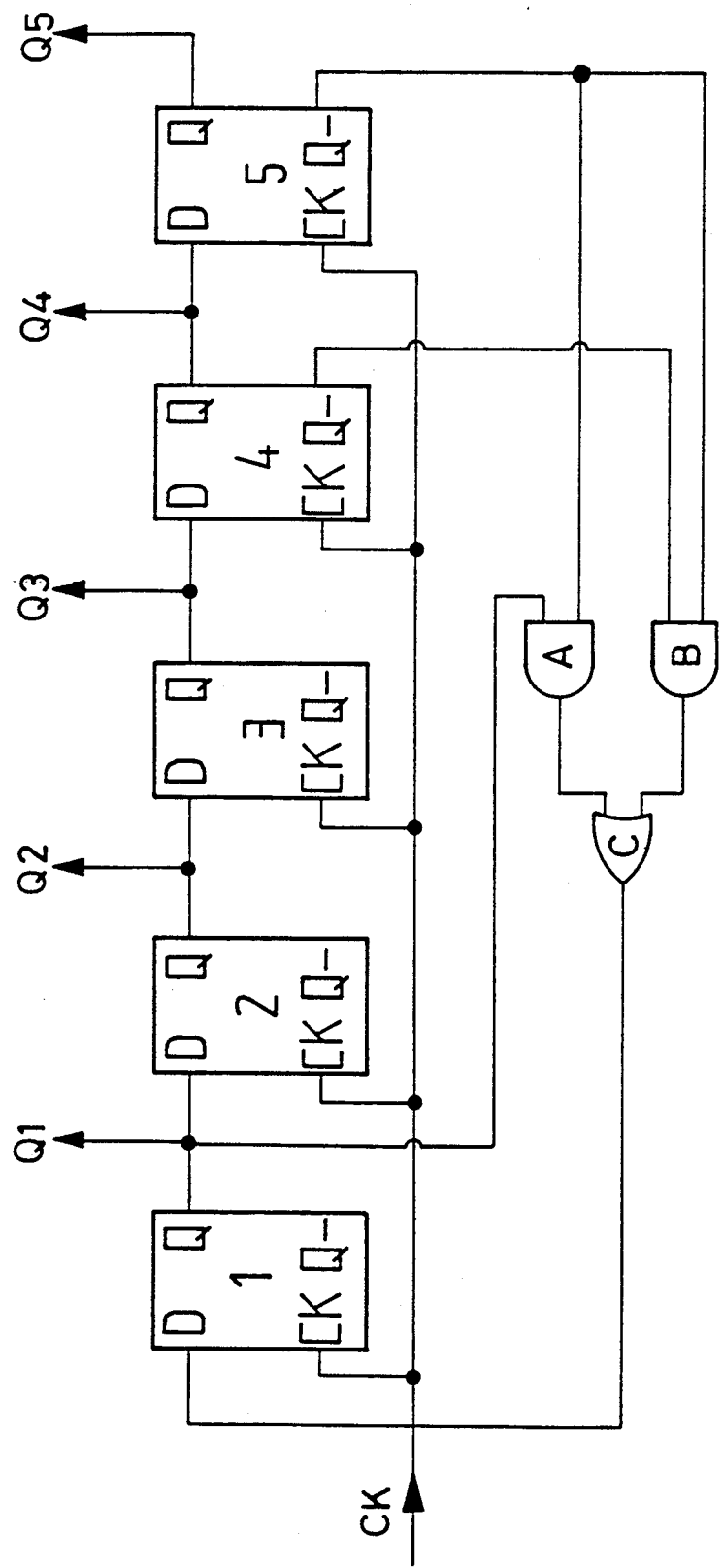
FIG. 4 is the circuit diagram of a logic circuit, known as Johnson counter, which may be realized with the programmable device of the invention of FIG. 3.
Figure 5:
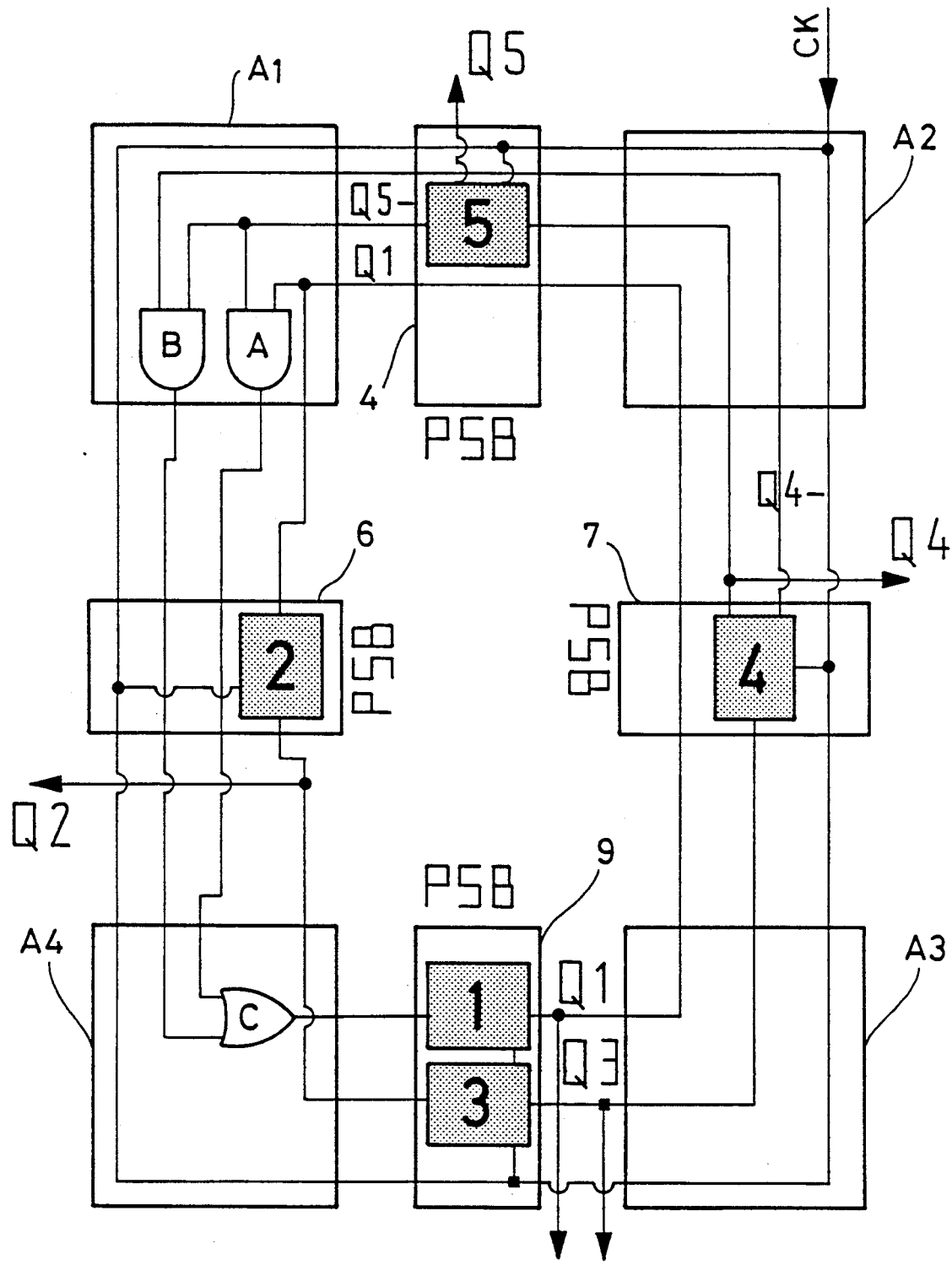
FIG. 5 shows a way by which the logic circuit of FIG. 4 (Johnson counter) is made with the programmable device of the invention of FIG. 3.

A first example of the versatility of the usage of the device of the present invention is depicted in FIGS. 4 and 5.

FIG. 4 shows the typical circuit diagram of a 10 module Johnson counter.

The five registers: 1, 2, 3, 4 and 5, the clock input CK and the five outputs: Q1, Q2, Q3, Q4 and Q5 are clearly recognizable. In FIG. 5 is shown how such a logic circuit may be made with a device of the invention having the architecture depicted in FIG. 3. The four arrays: A1, A2, A3 and A4, and four of the multifunctional circuit blocks PSB already depicted in the diagram of FIG. 3 and more precisely the blocks: 4, 6, 7 and 9, are reproduced in the diagram of FIG. 5. By programming, the Johnson counter circuit of FIG. 4 is made, as clearly shown in FIG. 5, by employing configurable registers available in the blocks PSB and implementing the two AND gates A and B in the A1 array and the OR gate C in the A4 array.

Figure 6:
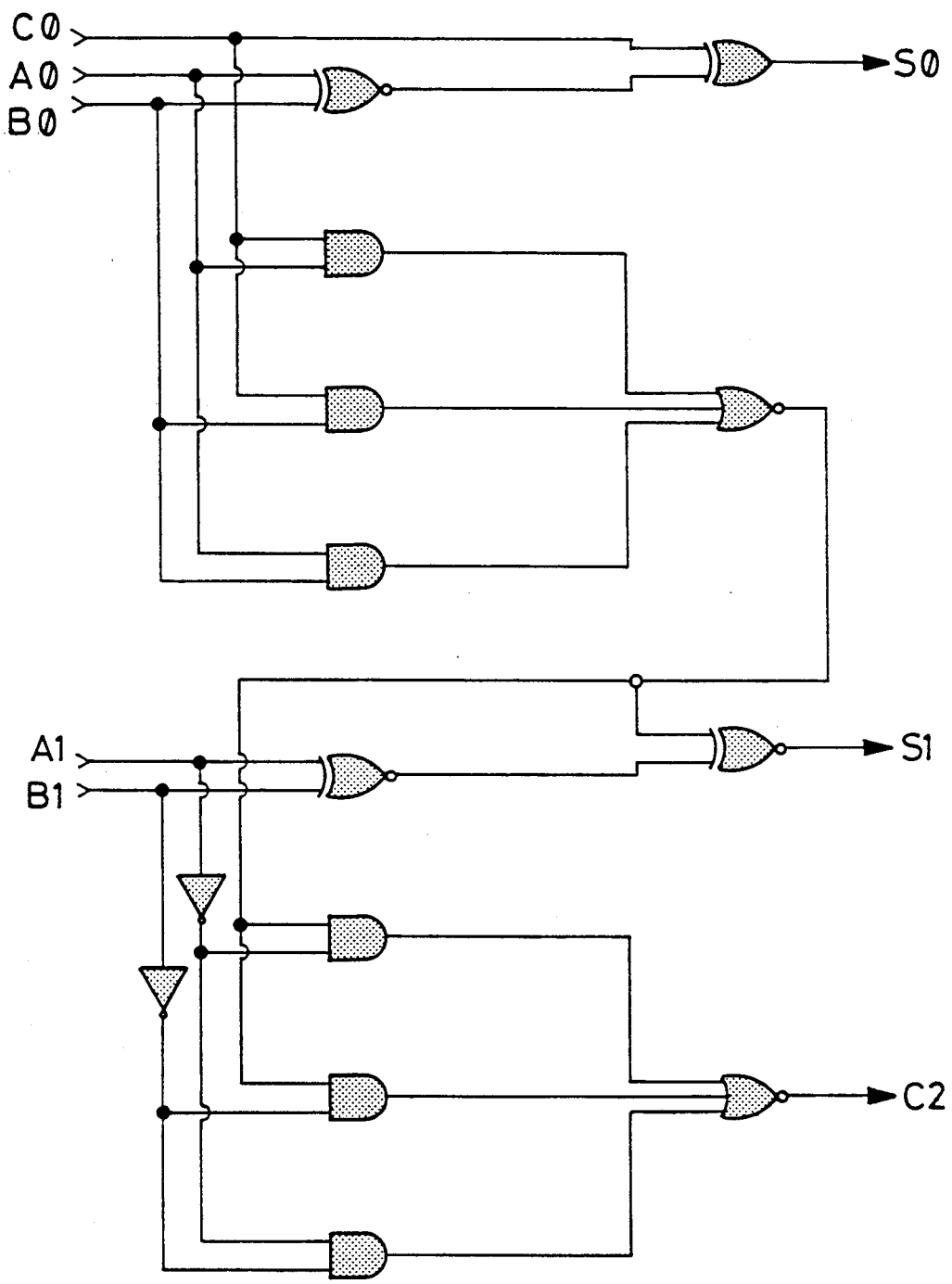
FIG. 6 is the circuit diagram of another logic circuit which may be made with the device of the invention of FIG. 3.
Figure 7:
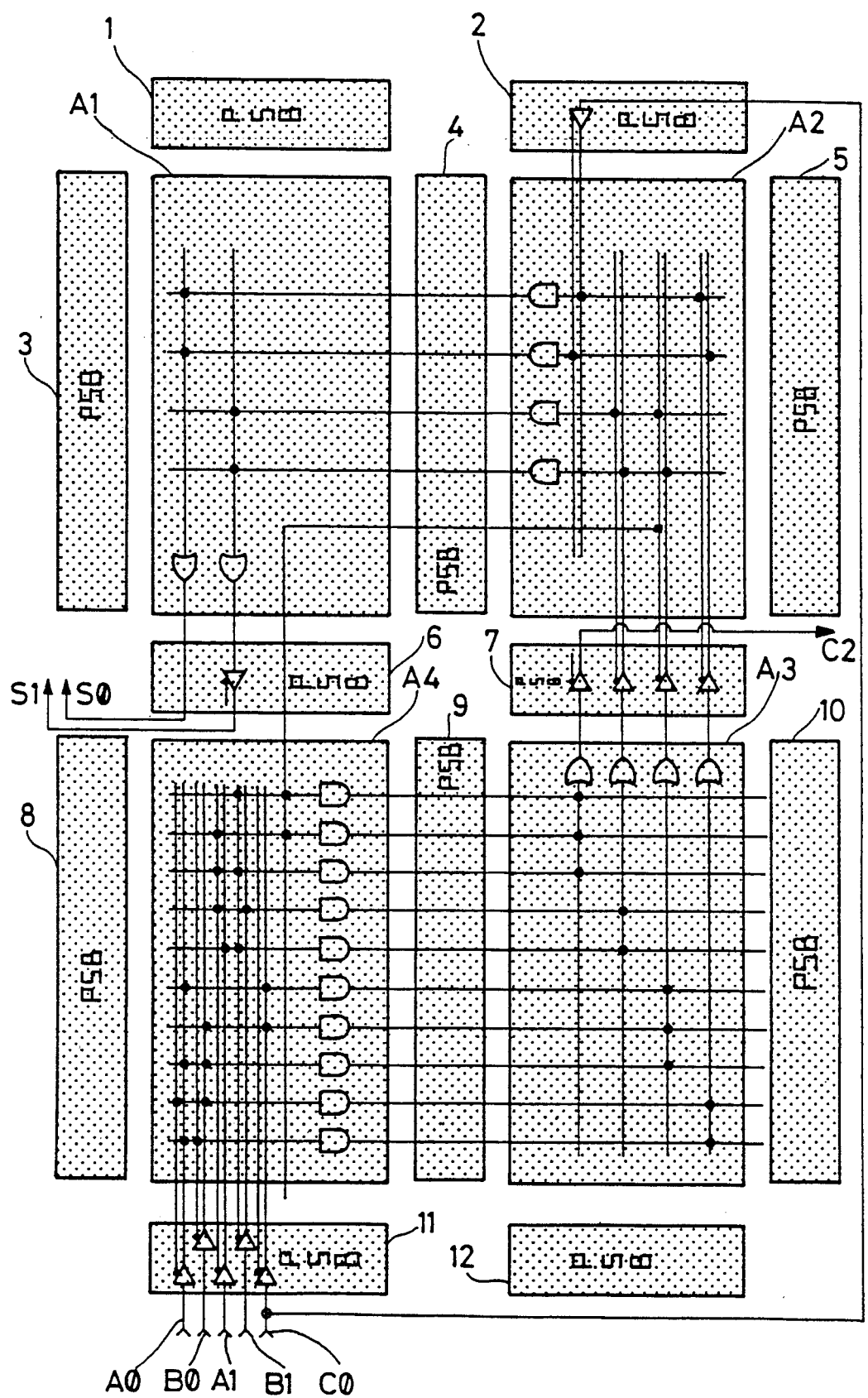
FIG. 7 shows the way by which the logic circuit of FIG. 6 may be made with the device of the invention of FIG. 3.

By means of the diagrams of FIGS. 6 and 7 a further example of use of the device of the invention for implementing a typical two-bit summing circuit, the functional diagram of which is well known and depicted in FIG. 6, is illustrated. As already done in the case of the preceding example, in FIG. 7 is clearly shown one way by which the circuit of FIG. 6 is made with a device of the invention by programming the latter which is again schematized by the four arrays A1, A2, A3 and A4 and multifunctional circuit blocks PSB 1, 2, 3, 4 . . . , 11 and 12, as in FIG. 3. The symbols used in the figures are conventional and the reading and interpretation of the diagrams permit to a skilled technician an immediate comprehension of the diagrams themselves, thus making abundantly superfluous a rehiterated description of the diagrams themselves. As it may be observed in the figures, the five inputs (C0, A0, B0 and A1 and B1) may be implemented through the multifunctional PSB block 11, by exploiting simultaneously the non-inverted and inverted signals which are generated within the PSB block itself, while the two outputs S0 and S1 are implemented through the multifunctional PSB block 6 and the output C2 is implemented through the functional PSB block 7.

Figure 8:
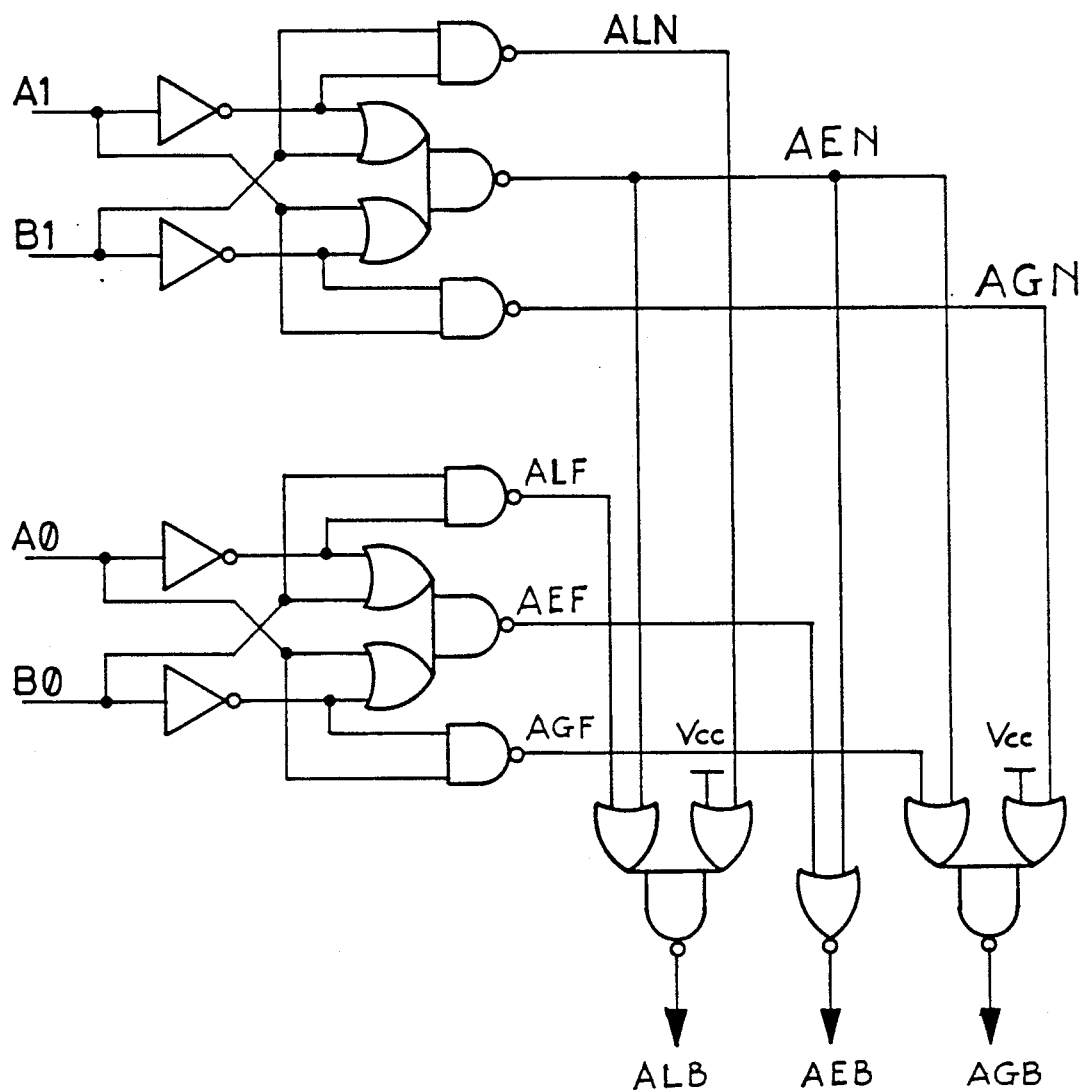
FIG. 8 is a further example of another logic circuit which may be made with the device of the invention of FIG. 3.
Figure 9:
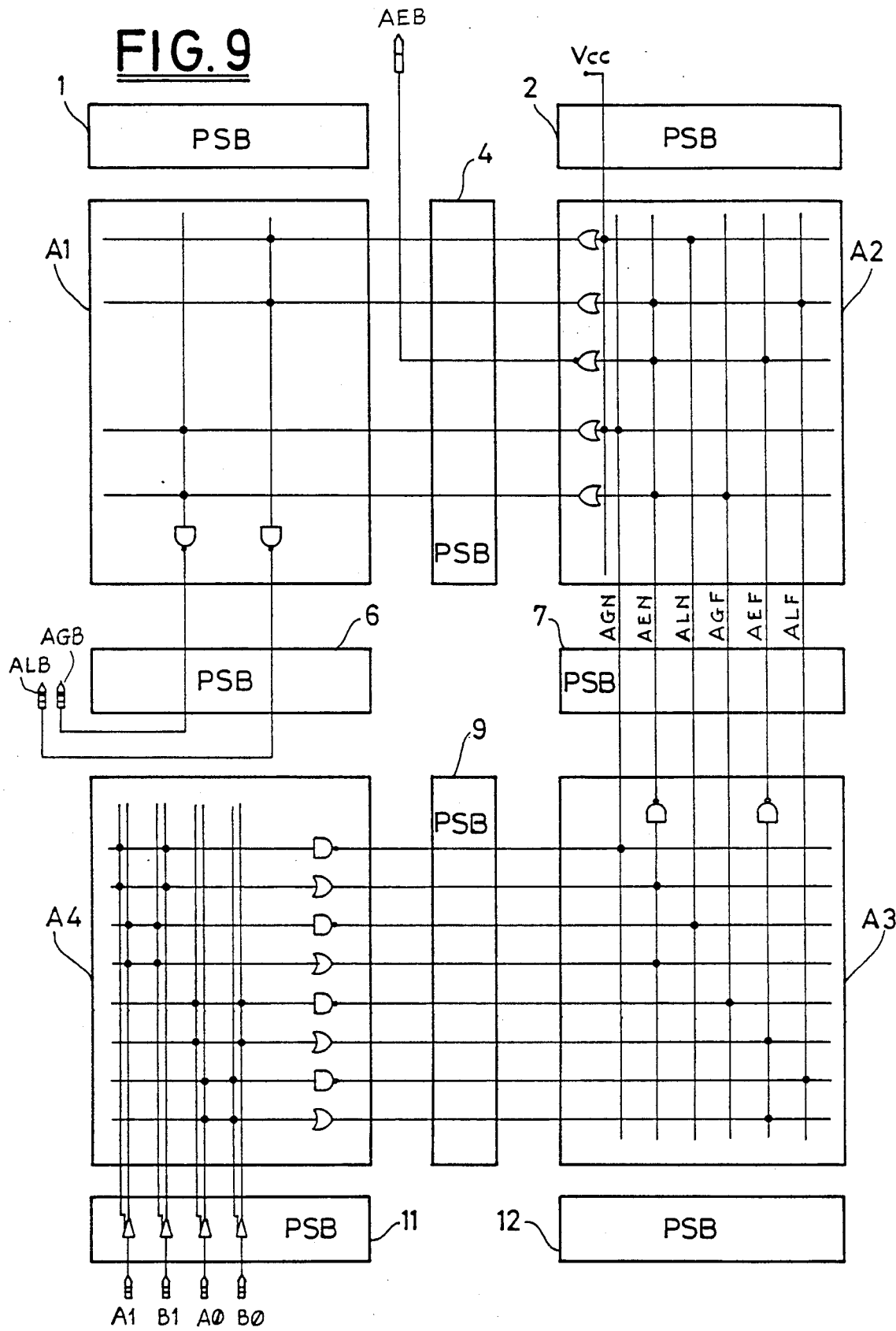
FIG. 9 shows how the logic circuit of FIG. 8 may be made with the device of the invention of FIG. 3.

Of course, as it will be obvious to the skilled technician, the same circuit may also be realized by "starting" (i.e. implementing the inputs) from a different block, i.e. by rotating the functional diagram in respect to the mosaic structure represented by the distinct programmable arrays and by the twelve multifunctional PSB blocks shown. A further example of utilization of the device of the invention is depicted in FIGS. 8 and 9. FIG. 8 shows a typical block diagram of a two-bit amplitude comparator circuit. In FIG. 9 is shown a way by which the circuit of FIG. 9 may be implemented by means of a device of the invention comprising four arrays: A1, A2, A3 and A4 and the multifunctional PSB blocks: 1 to 12, as in the preceding examples. In this last example, it may be noted as an array may be programmed so as to obtain certain logic functions, by emphasizing the fact that in the device of the invention the distinct arrays of programmable memory cells are not necessarily programmed so as to implement an unique determining logic function but may be programmed for implementing a plurality of logic functions different from each other, in accordance with the needs of the user.

The organization module of the device of the invention, which may be represented by a mosaic of arrays and multifunctional PSB interfacing blocks between arrays and arrays and between arrays and external pins of the device, may be expanded in such a way as to be limited in practice only by the necessity of maintaining overall dimensions of the device within reasonably manageable terms.

Figure 10:
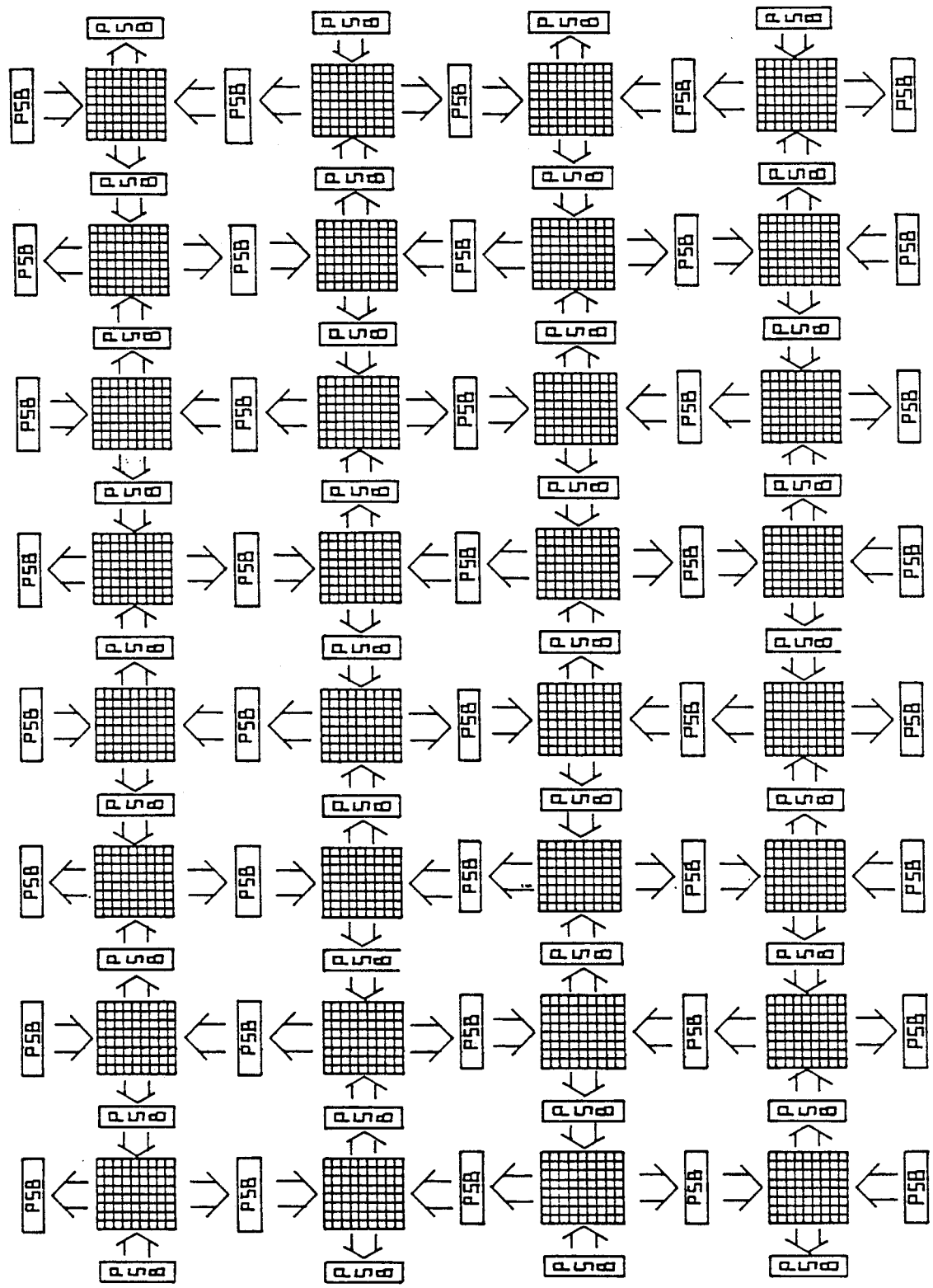
FIG. 10 shows how the basic structure of a device of the invention may be expanded in a network of distributed memory arrays containing thirty-two distinct arrays of programmable memory cells.

In FIG. 10 it is shown how the base module of the device of the invention may be expanded until containing, as shown in the figure, thirty-two distinct programmable arrays of memory cells.

As it clearly emerges from what has been described above, the outstanding management flexibility of the device is determined by the presence of a plurality of arrays of programmable memory cells which are functionally complete and may be accessed substantially from any internal point of the device and from any external pin by means of said multifunctional PSB blocks interfacing an array with another and an array with the external world.

Figure 11:
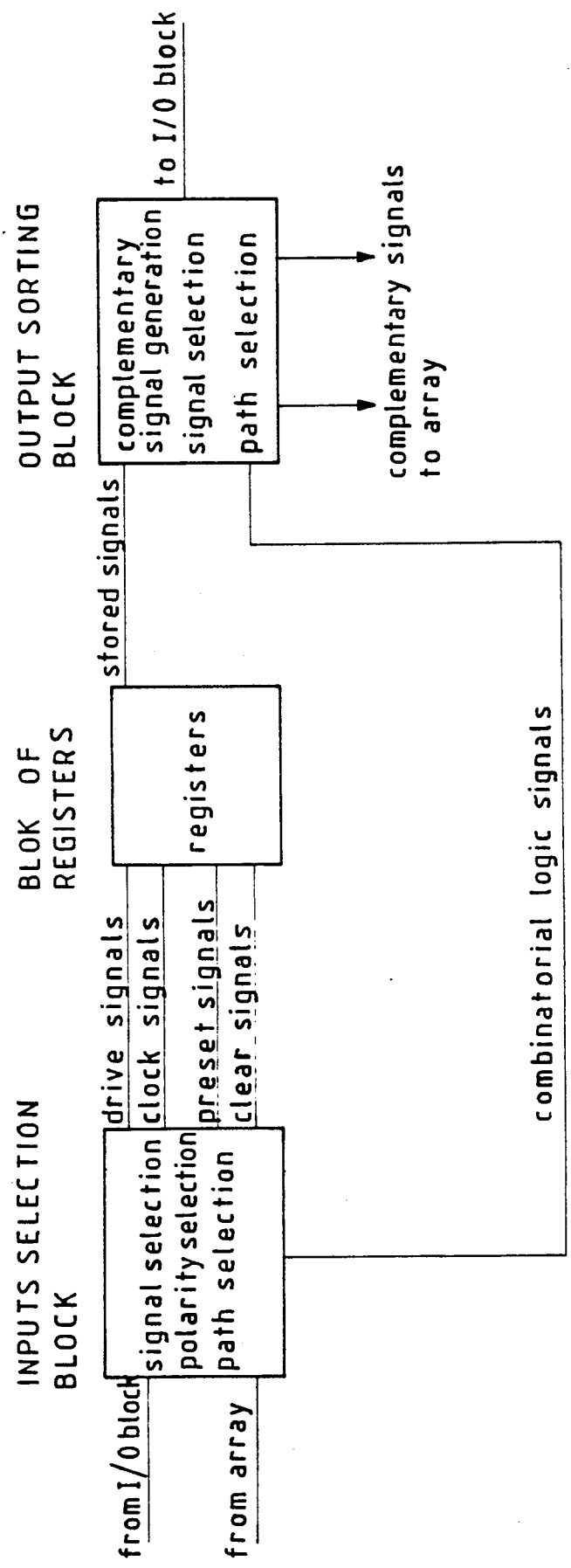
FIG. 11 is the diagram of a multifunctional circuit block (PSB) used in the netlike layout of distributed memory arrays of the device of the invention.

A basic diagram of the PSB blocks used in the device of the invention is shown in FIG. 11.

Of course a multifunctional PSB block may contain any number of modules identical to the unitary one depicted in FIG. 11.

Essentially the base module of any PSB block contains three fundamental sub-blocks: an input selection block, a block of registers and an output sorting block. The input selection block may contain means for reading signals coming from an array, signal selection means, polarity selection means and path selection means. The block of registers permits to produce for a certain signal coming from the input selection block a stored type replica signal which may be applied, as well as the non-stored type signal coming directly from the input selection block, to an output sorting block which contains means for generating complementary signals, signal selection means, polarity selection means and path selection means. A certain signal may then be directed, by enabling an output buffer, to a pad or an I/O pin of the integrated device and/or a complementary signal may be directed toward a certain array of the integrated device.

Figure 12:
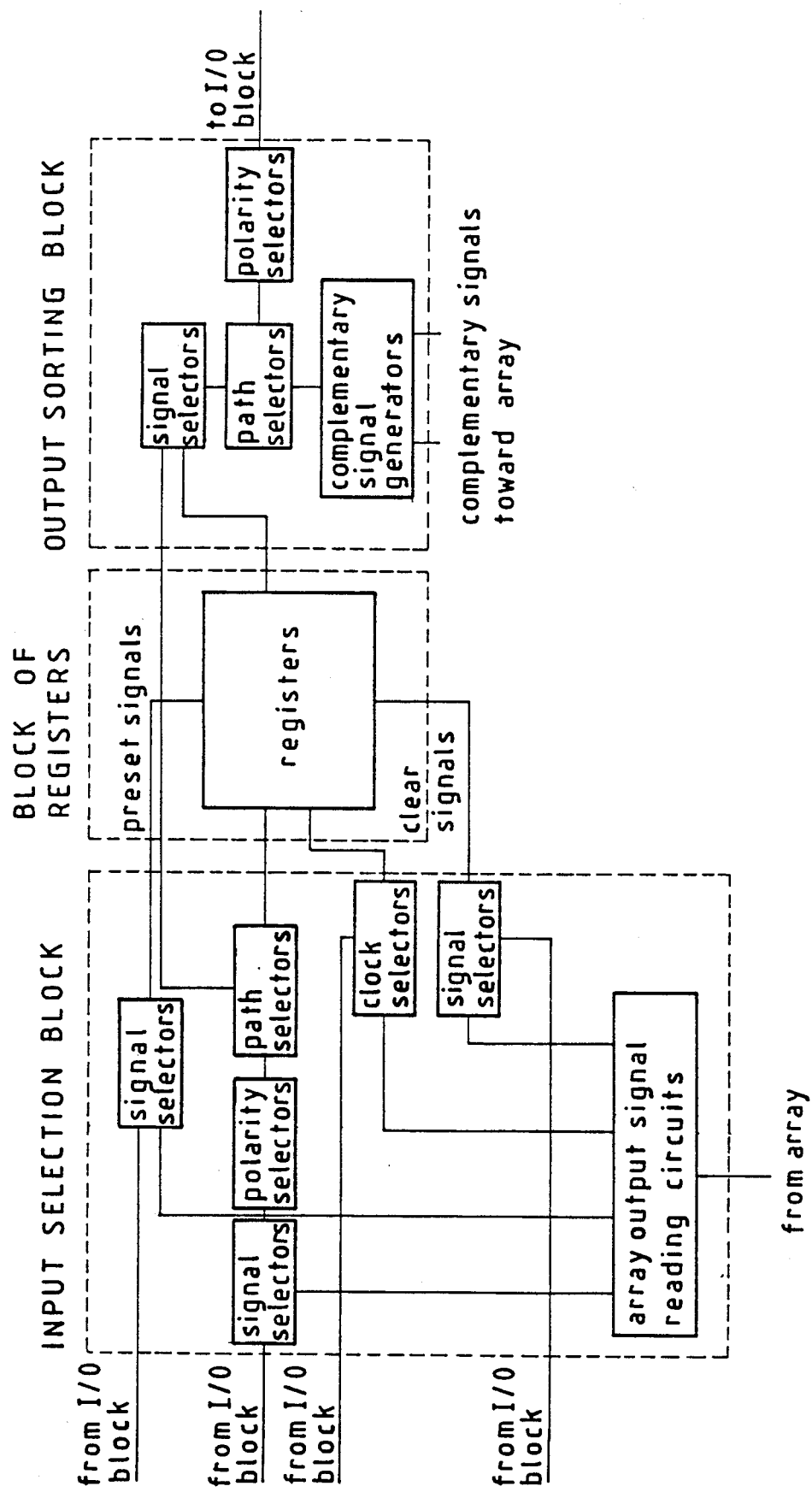
FIG. 12 is a more detailed diagram of the multifunctional circuit block (PSB) of FIG. 11.

A more detailed block diagram of a base module of a PSB block is shown in FIG. 12, which may be easily interpreted by any skilled technician.

Figure 13:
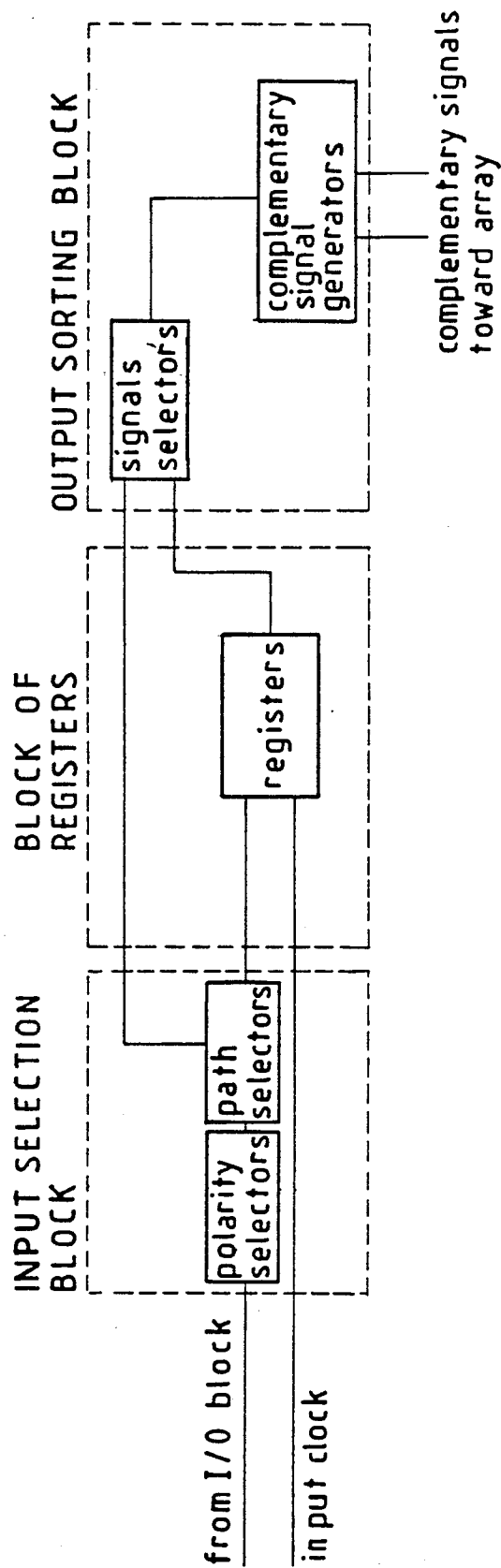
FIG. 13 depicts a modified block diagram of a multifunctional circuit block (PSB) having a specifically specialized structure.
Figure 14:
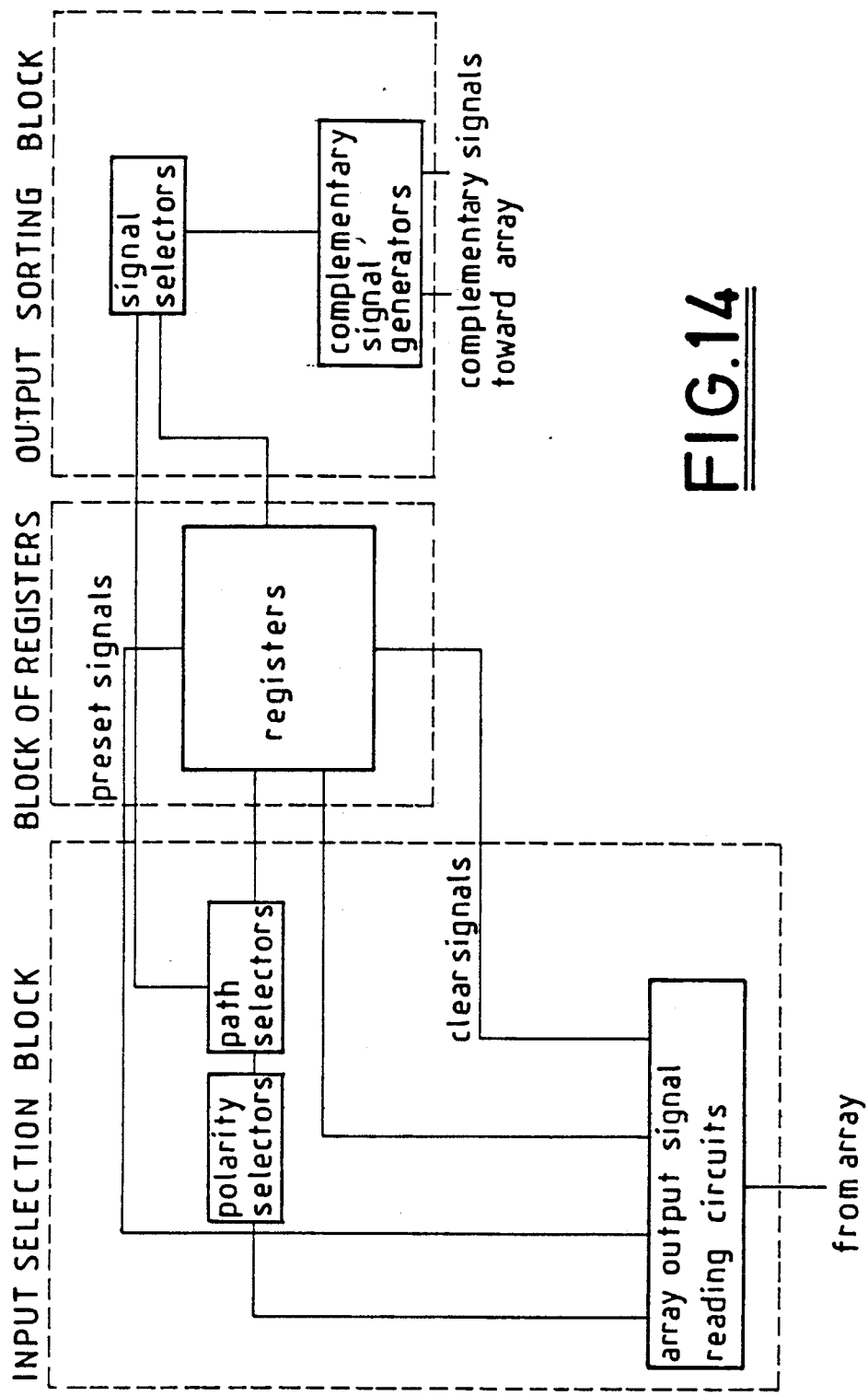
FIG. 14 shows a modified block diagram of a multifunctional circuit block (PSB) having a differen specifically specialized structure.

The base module shown in FIGS. 11 and 12 may be considered as a modular unity of a multifunctional PSB block. All the multifunctional PSB blocks of the device of the invention, even though may also be considered substantially identical among each other, may in practice be relatively different under some aspects. They may for example contain a different number of elementary base modules, but above all the most important difference which may exist between a type or group of PSB blocks and another type or group of PSB blocks is represented by the fact that one type or group of PSB blocks may have wired connections between their own input terminals and as many pads or bidirectional I/O pins of the integrated device and may not contain array output reading means, as shown in the diagram of FIG. 13, while another type or group of PSB blocks (typically the "internal" and "output" PSB blocks of the mosaic organization of the various PSB blocks and arrays) because they normally receive signals coming from memory arrays they necessarily contain suitable reading means while they may or may not have wired connections with I/O pins. This is especially so in integrated device having a relatively large number of arrays (and of PSB blocks). The circuit diagram of these "internal" PSB blocks may be the one depicted in FIG. 14. In other words the multifunctional PSB blocks intermingingly arranged together with the arrays of memory cells in a mosaic-like layout may conveniently be of two specialized species, marginally different one from the other: a first or "internal" species designed essentially for interfacing arrays among each other; the second or "peripheral" species designed for interfacing with the pads or external pins of the integrated device.

What we claim is:

1. An integrated logic device having a plurality of bidirectional input/output pins and comprising means capable of constituting a plurality of programmable and addressable memory cell arrays, arranged in rows and columns, which cells may be individually programmed by altering their electrical conductivity status, each of said arrays having inputs and outputs; a plurality of multifunctional blocks each containing input selection circuitry capable of receiving input signals coming from said bidirectional input/output pins and/or from outputs of said arrays, signal selection means, polarity selection means and path selection means, a plurality of registers and an output sorting circuitry capable of selecting non-stored and stored type data containing signals, selecting the polarity and the path of said signals toward enableable output buffers driving said plurality of bidirectional input/output pins and/or toward one of said arrays, circuitry capable of producing for each of said data containing signals a first, non-inverted and a second, inverted, buffered replica signals by means of which the rows of one or more of said memory cell arrays are driven for producing output signals from said arrays, each of said arrays being programmable for producing different logic functions for any combination of inputs of the same array.

2. An integrated logic device in accordance with claim 1, wherein said input selection circuitry, said registers and said output sorting circuitry are contained in every multifunctional block of said plurality of multifunctional blocks arranged around each of said arrays and forming with said arrays a mosaic-type arrangement, whereby data exchanges between two different arrays and between an array and the external world takes place essentially through at least one of said multifunctional blocks.

3. An integrated logic device according to claim 2, wherein at least some of said multifunctional blocks which are internal in respect to the mosaic-like arrangement of the pluralities of said arrays and multifunctional blocks, have an input selection circuitry capable of receiving input signals coming exclusively from the outputs of one of said arrays and said output sorting circuitry produces output signals directed exclusively toward an input circuitry of another of said arrays.

4. An integrated logic device in accordance with claim 2, wherein at least some of said multifunctional blocks which are peripheral in respect to the said mosaic-like arrangement of said pluralities of arrays and multifunctional blocks, have inputs wired to respective bidirectional input/output pins of the integrated device.

* * * * *